United States Patent
Lee (10) Patent No.: US 7,450,464 B2
(45) Date of Patent: Nov. 11, 2008

(54) CIRCUIT AND METHOD FOR DETECTING SYNCHRONOUS MODE IN A SEMICONDUCTOR MEMORY APPARATUS

(75) Inventor: Sang-Kwon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 6 days.

(21) Appl. No.: 11/641,044

(22) Filed: Dec. 19, 2006

(65) Prior Publication Data

US 2007/0211558 A1 Sep. 13, 2007

(30) Foreign Application Priority Data

Mar. 7, 2006 (KR) ...................... 10-2006-0021221

(51) Int. Cl.
*G11C 11/00* (2006.01)

(52) U.S. Cl. ............................ 365/233.05; 365/230.06

(58) Field of Classification Search ............ 365/230.08, 365/233
See application file for complete search history.

(56) References Cited

U.S. PATENT DOCUMENTS

| | | | | |
|---|---|---|---|---|
| 5,297,270 A | * | 3/1994 | Olson | 711/3 |
| 5,404,338 A | * | 4/1995 | Murai et al. | 365/189.05 |
| 5,446,403 A | * | 8/1995 | Witkowski | 327/143 |
| 5,592,685 A | * | 1/1997 | Pawlowski | 710/62 |
| 5,696,730 A | * | 12/1997 | Slezak et al. | 365/227 |
| 6,058,451 A | * | 5/2000 | Bermingham et al. | 711/106 |
| 6,075,830 A | * | 6/2000 | Piirainen | 375/354 |
| 7,058,776 B2 | | 6/2006 | Lee | |
| 7,069,406 B2 | | 6/2006 | Hronik | |
| 2005/0207254 A1 | * | 9/2005 | Lovett | 365/222 |
| 2005/0226090 A1 | | 10/2005 | Lee | |
| 2005/0232065 A1 | * | 10/2005 | Jeong | 365/233 |
| 2006/0044933 A1 | * | 3/2006 | Roohparvar | 365/233 |
| 2006/0164902 A1 | | 7/2006 | Fung | |
| 2006/0291323 A1 | * | 12/2006 | Freebern | 365/233 |

FOREIGN PATENT DOCUMENTS

| | | |
|---|---|---|
| JP | 2005302252 | 10/2005 |
| KR | 1019970012702 | 3/1997 |
| KR | 1020037012390 | 9/2003 |
| KR | 1020050100262 | 10/2005 |

* cited by examiner

*Primary Examiner*—Michael T Tran
(74) *Attorney, Agent, or Firm*—Venable LLP; Jeffri A. Kaminski

(57) ABSTRACT

A circuit for detecting synchronous mode in a semiconductor memory apparatus includes a control unit that controls the driving of a clock according to whether or not a valid address signal is enabled. A driving unit drives the clock according to the control of the control unit. A latch unit latches the clock driven by the driving unit and outputs a synchronous mode signal.

60 Claims, 4 Drawing Sheets

CIRCUIT AND METHOD FOR DETECTING SYNCHRONOUS MODE IN A SEMICONDUCTOR MEMORY APPARATUS

CROSS-REFERENCE TO RELATED PATENT APPLICATION

This application claims the benefit of Korean Patent Application No. 10-2006-0021221, filed on Mar. 7, 2006, in the Korean Intellectual Property Office, the disclosure of which is incorporated herein in its entirety by reference.

BACKGROUND OF THE INVENTION

1. Technical Field

The present invention relates to a circuit and method for detecting a synchronous mode in a semiconductor memory apparatus, and in particular, to a circuit and method for detecting a synchronous mode in a semiconductor memory apparatus capable of distinguishing a synchronous mode, in which a clock is input, and an asynchronous mode, in which a clock is not input, from each other.

2. Related Art

A semiconductor memory apparatus, such as a pseudo SRAM provided in a mobile communication terminal or the like, operates by selectively using a clock. That is, the clock is selectively input according to when a clock is necessary and when the clock is unnecessary. Then, when the clock is input, individual circuits provided in the semiconductor memory apparatus need to judge whether or not the clock is input.

However, a known semiconductor memory apparatus does not easily judge a synchronous mode where the clock is input and an asynchronous mode where the clock is not input. Accordingly, there is a technical limitation to apply an advanced technology to such a semiconductor memory apparatus.

SUMMARY OF THE INVENTION

Embodiments of the present invention provide a circuit and method for detecting a synchronous mode in a semiconductor memory apparatus that enables a synchronous mode signal when a clock is input and disables the synchronous mode signal when the clock is not input, thereby allowing a synchronous mode and an asynchronous mode to be distinguished from each other.

An embodiment of the present invention provides a circuit for detecting a synchronous mode in a semiconductor memory apparatus comprising: a control unit that controls the driving of a clock according to whether or not a valid address signal is enabled; a driving unit that drives the clock according to the control of the control unit; and a latch unit that latches the clock driven by the driving unit and outputs a synchronous mode signal.

Another embodiment of the present invention provides a circuit for detecting a synchronous mode in a semiconductor memory apparatus comprising: a control unit that generates a valid address pulse signal to control the supply of a first voltage, when a valid address signal is enabled; a driving unit that inversely drives the clock regardless of the supply of the first voltage when a clock is at a high level, and inversely drives the clock when the first voltage is supplied when the clock is at a low level; and a latch unit that latches the signal driven by the driving unit and outputs a synchronous mode signal.

Still another embodiment of the invention provides a circuit for detecting a synchronous mode in a semiconductor memory apparatus comprising: a first signal combining unit that combines a valid address signal and a clock to generate a reference signal; a first latch unit that latches the reference signal; a second signal combining unit that combines an output signal of the first latch unit and the clock to generate a detection pulse signal; a control unit that controls the driving of the detection pulse signal according to whether or not the valid address signal is enabled; a driving unit that drives the detection pulse signal according to the control of the control unit; and a latch unit that latches the signal driven by the driving unit and outputs a synchronous mode signal.

Yet another embodiment of the invention provides a circuit for detecting a synchronous mode in a semiconductor memory apparatus comprising: a first signal combining unit that generates first and second signals by driving a clock according to whether or not a valid address signal is enabled, and generates a reference signal from the first and second signals; a first latch unit that latches the reference signal; a second signal combining unit that generates a detection pulse signal forming a low-level voltage if an output signal of the first latch unit is at a high level, and forming a high-level voltage through inversion of the clock if the output signal of the first latch unit is at a low level; a control unit that generates a valid address pulse signal to control the supply of a first voltage, when a valid address signal is enabled; a driving unit that inversely drives the clock regardless of the supply of the first voltage when a clock is at a high level, and inversely drives the clock when the first voltage is supplied when the clock is at a low level; and a latch unit that latches the signal driven by the driving unit and outputs a synchronous mode signal.

Another embodiment of the invention provides a method for detecting a synchronous mode in a semiconductor memory apparatus comprising: controlling the driving of a clock according to whether or not a valid address signal is enabled; driving the clock according to the control; and latching the driven clock and outputting a synchronous mode signal.

Still another embodiment of the invention provides a method for detecting a synchronous mode in a semiconductor memory apparatus comprising: combining a valid address signal and a clock to generate a reference signal; latching the reference signal; combining the latched signal and the clock to generate a detection pulse signal; controlling the driving of the detection pulse signal according to whether or not the valid address signal is enabled; driving the detection pulse signal according to the control; and latching the driven detection pulse signal and outputting a synchronous mode signal.

DESCRIPTION OF EXEMPLARY EMBODIMENTS

Hereinafter, exemplary embodiments of the present invention will be described in detail with reference to the accompanying drawings.

Figure 1:
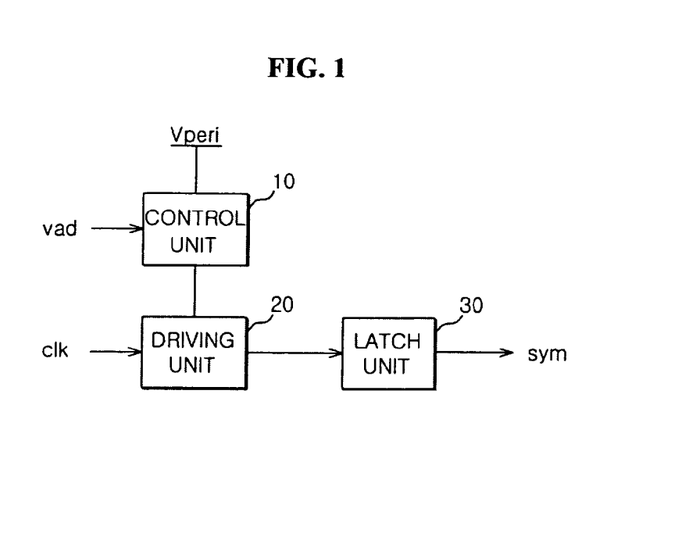
FIG. 1 is a block diagram showing the structure of a circuit for detecting a synchronous mode in a semiconductor memory apparatus according to an embodiment of the present invention.

FIG. 1 is a block diagram showing the structure of a circuit for detecting a synchronous mode in a semiconductor memory apparatus according to an embodiment of the present invention.

As shown in FIG. 1, the circuit for detecting a synchronous mode includes a control unit 10 that controls the driving of a clock clk according to whether or not a valid address signal vad is enabled, a driving unit 20 that drives the clock clk according to the control of the control unit 10, and a latch unit 30 that latches the signal driven by the driving unit 20 and outputs a synchronous mode signal sym.

The valid address signal vad is a high level enable signal that is generated by inverting the phase of a valid address command (hereinafter, /ADV signal), and is used to allow an address to be input to an address buffer. The /ADV signal is input from outside the semiconductor memory apparatus and sets the interval for inputting an address. Further, the synchronous mode signal sym is a low level enable signal that is output as a low-level signal in a synchronous mode and is output a high-level signal in an asynchronous mode.

If the valid address signal vad is enabled, the control unit 10 supplies a peripheral voltage Vperi to the driving unit 20 for a predetermined time. At this time, the driving unit 20 inversely drives the clock clk and an inverted clock is transmitted to the latch unit 30. Subsequently, the latch unit 30 latches and stores the signal transmitted from the driving unit 20, inverts the signal again, and outputs the inverted signal as the synchronous mode signal sym.

Meanwhile, in a period where the peripheral voltage Vperi is not supplied to the driving unit 20, the driving unit 20 does not inversely drive the clock clk. However, since the latch unit 30 keeps the previously transmitted signal, the synchronous mode signal sym is continuously output.

Hereinafter, a detailed description will be given for a circuit for detecting synchronous mode with reference to FIG. 2.

Figure 2:
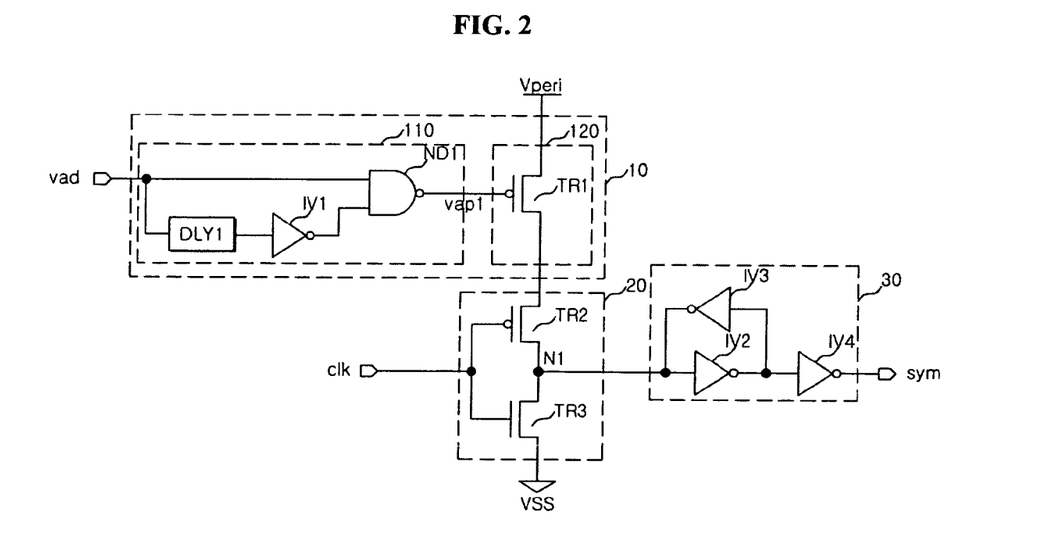
FIG. 2 is a circuit diagram showing the detailed structure of the circuit for detecting a synchronous mode shown in FIG. 1.

FIG. 2 is a circuit diagram showing the detailed structure of the circuit for detecting a synchronous mode according to the embodiment shown in FIG. 1.

In the circuit for detecting a synchronous mode, the control unit 10 includes a first pulse generator 110 that receives the valid address signal vad and outputs a first valid address pulse signal vap1; and a first voltage driver 120 that drives the peripheral voltage Vperi according to whether or not the first valid address pulse signal vap1 is enabled.

The first pulse generator 110 includes a first delay unit DLY1 that delays the valid address signal vad by a predetermined time; a first inverter IV1 that inverts an output signal of the first delay unit DLY1, and a first NAND gate ND1 that receives the valid address signal vad and an output signal of the first inverter IV1 and outputs the first valid address pulse signal vap1.

Further, the first voltage driver 120 includes a first transistor TR1, to which the first valid address pulse signal vap1 is input to its gate terminal, a source terminal is applied with the peripheral voltage Vperi, and the drain terminal is coupled with the driving unit 20.

The driving unit 20 includes a second transistor TR2, to which the clock clk is input to its gate terminal, a source terminal is coupled with the drain terminal of the first transistor TR1 of the control unit 10, and a drain terminal is coupled with a first node N1; and a third transistor TR3 to which the clock clk is input to its gate terminal, a drain terminal is coupled with the first node N1, and a source terminal is coupled with a ground terminal.

The latch unit 30 includes a second inverter IV2 that inverts a signal transmitted to the first node N1; a third inverter IV3 that forms a latch structure together with the second inverter IV2; and a fourth inverter IV4 that inverts an output signal of the second inverter IV2.

A signal that is output from the fourth inverter IV4 becomes the synchronous mode signal sym.

Since the valid address signal vad is the high level enable signal, the first valid address pulse signal vap1 output from the first NAND gate ND1 becomes the low level enable signal with an enable time shorter than the valid address signal vad. If the first valid address pulse signal vap1 is enabled, the first transistor TR1 of the control unit 10 is turned on, and thus the driving unit 20 inverts the clock clk and transmits the inverted clock to the first node N1. Subsequently, the second and third inverters IV2 and W3 of the latch unit 30 store the signal transmitted to the first node N1. Then, the fourth inverter IV4 inverts an output signal of the second inverter IV2 and outputs the inverted signal as the synchronous mode signal sym.

Meanwhile, if the first valid address pulse signal vap1 is disabled, the first transistor TR1 of the control unit 10 is turned off, and thus the driving unit 20 does not transmit the clock clk to the first node N1. At this time, the synchronous mode signal sym is continuously output from the signal stored in the second and third inverters IV2 and IV3 of the latch unit 30.

As such, the circuit for detecting a synchronous mode drives and latches the clock clk according to the control of the input valid address signal vad so as to generate the synchronous mode signal sym. Subsequently, the apparatuses receiving the synchronous mode signal sym can recognize that a current mode is an asynchronous mode since the synchronous mode signal sym is disabled if the clock clk is not input, and the apparatuses can also recognize that a current mode is a synchronous mode since the synchronous mode signal sym is enabled if the clock clk is input.

Figure 3:
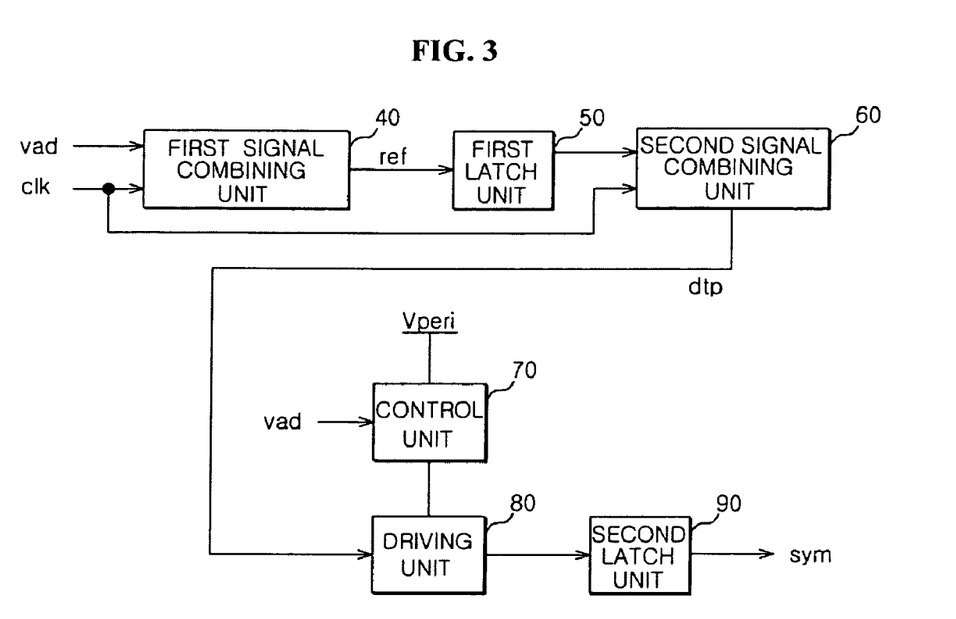
FIG. 3 is a block diagram showing the structure of a circuit for detecting synchronous mode in a semiconductor memory apparatus according to another embodiment of the invention.

FIG. 3 is a block diagram showing the structure of a circuit for detecting a synchronous mode for a semiconductor memory apparatus according to another embodiment of the present invention.

The circuit for detecting synchronous mode shown in FIG. 3 includes a first signal combining unit 40 that combines a valid address signal vad and a clock clk so as to generate a reference signal ref; a first latch unit 50 that latches the reference signal ref; a second signal combining unit 60 that combines an output signal of the first latch unit 50 and the clock clk so as to generate a detection pulse signal dtp; a control unit 70 that controls driving and latching of the detection pulse signal dtp according to whether or not the valid address signal vad is enabled; a driving unit 80 that drives the detection pulse signal dtp according to the control of the control unit 70; and a second latch unit 90 that latches the signal driven by the driving unit 80 and outputs a synchronous mode signal sym.

The first signal combining unit 40 generates the reference signal ref according to the voltage levels of the valid address signal vad and the clock clk. Subsequently, the reference signal ref is latched and driven in the first latch unit 50 and then transmitted to the second signal combining unit 60. The second signal combining unit 60 combines the signal transmitted from the first latch unit 50 and the clock clk so as to generate the detection pulse signal dtp.

If the valid address signal vad is enabled, the control unit 70 supplies a peripheral voltage Vperi to the driving unit 80 for a predetermined time. At this time, the driving unit 80 inversely drives the detection pulse signal dtp and transmits the inverted signal to the second latch unit 90. Subsequently, the second latch unit 90 latches and stores the signal transmitted from the driving unit 80, inverts the signal again, and outputs the inverted signal as the synchronous mode signal sym.

Meanwhile, in a period where the peripheral voltage Vperi is not supplied to the driving unit 80, the driving unit 80 does not inversely drive the detection pulse signal dtp. Meanwhile, since the second latch unit 90 keeps the previously transmitted signal, the synchronous mode signal sym is continuously output.

Hereinafter, a detailed description will be given for the circuit for detecting synchronous mode shown in FIG. 3 with reference to FIGS. 4 and 5.

Figure 4:
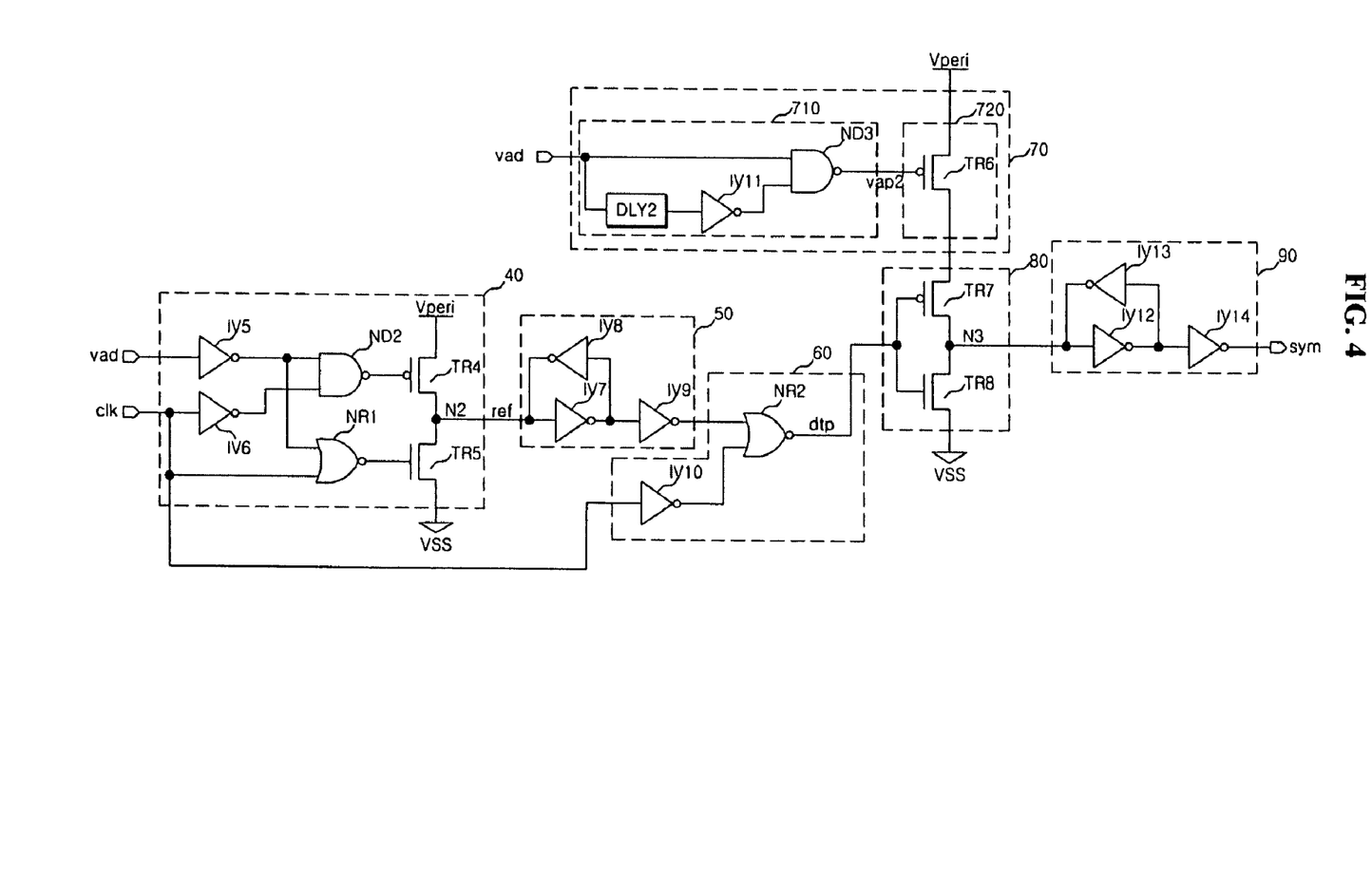
FIG. 4 is a circuit diagram showing the detailed structure of the circuit for detecting a synchronous mode shown in FIG. 3.

FIG. 4 is a circuit diagram showing the detailed structure of the circuit for detecting synchronous mode shown in FIG. 3. FIG. 5 is a timing chart illustrating the operation of the circuit for detecting synchronous mode shown in FIG. 4.

Referring to FIG. 4, the first signal combining unit 40 includes a fifth inverter IV5 that inverts the valid address signal vad; a sixth inverter IV6 that inverts the clock clk; a second NAND gate ND2 that receives an output signal of the fifth inverter IV5 and an output signal of the sixth inverter IV6; a first NOR gate NR1 that receives the output signal of the fifth inverter IV5 and the clock clk; a fourth transistor TR4, to which an output signal of the second NAND gate ND2 is input to its gate terminal, a source terminal is applied with the peripheral voltage Vperi, and a drain terminal is coupled with a second node N2; and a fifth transistor TR5, to which an output signal of the first NOR gate NR1 is input to its gate terminal, a drain terminal is coupled with the second node N2, and a source terminal is coupled to the ground terminal.

A signal that is formed at the second node N2 becomes the reference signal ref.

The first latch unit 50 includes a seventh inverter IV7 that inverts the reference signal ref; an eighth inverter IV8 that forms a latch structure together with the seventh inverter IV7; and a ninth inverter IV9 that inverts an output signal of the seventh inverter IV7.

The second signal combining unit 60 includes a tenth inverter IV10 that inverts the clock clk; and a second NOR gate NR2 that receives an output signal of the ninth inverter IV9 and an output signal of the tenth inverter IV10 and outputs the detection pulse signal dtp.

The control unit 70 includes a second pulse generator 710 that receives the valid address signal vad and outputs a second valid address pulse signal vap2; and a second voltage driver 720 that drives the peripheral voltage Vperi according to whether or not the second valid address pulse signal vap2 is enabled.

The second pulse generator 710 includes a second delay DLY2 that delays the valid address signal vad by a predetermined time; an eleventh inverter IV11 that inverts an output signal of the second delay unit DLY2; and a third NAND gate ND3 that receives the valid address signal vad and an output signal of the eleventh inverter IV11 and outputs the second valid address pulse signal vap2.

Further, the second voltage driver 720 includes a sixth transistor TR6, to which the second valid address pulse signal vap2 is input to its gate terminal, and a source terminal is applied with the peripheral voltage Vperi, and the source terminal is coupled with the driving unit 80.

The driving unit 80 includes a seventh transistor TR7, to which the detection pulse signal dtp is input its gate terminal, a source terminal is coupled with a drain terminal of the sixth transistor TR6 of the control unit 70, and a drain terminal coupled with a third node N3; and an eighth transistor TR8, to which the detection pulse signal dtp is input its gate terminal, a drain terminal is coupled to the third node N3, and a source terminal is coupled with the ground terminal.

The second latch unit 90 includes a twelfth inverter, IV12 that inverts a signal transmitted to the third node N3; a thirteenth inverter IV13 that forms a latch structure together with the twelfth inverter IV12; and a fourteenth inverter IV14 that inverts an output signal of the twelfth inverter IV12.

A signal that is output from the fourteenth inverter IV14 becomes the synchronous mode signal sym.

Figure 5:
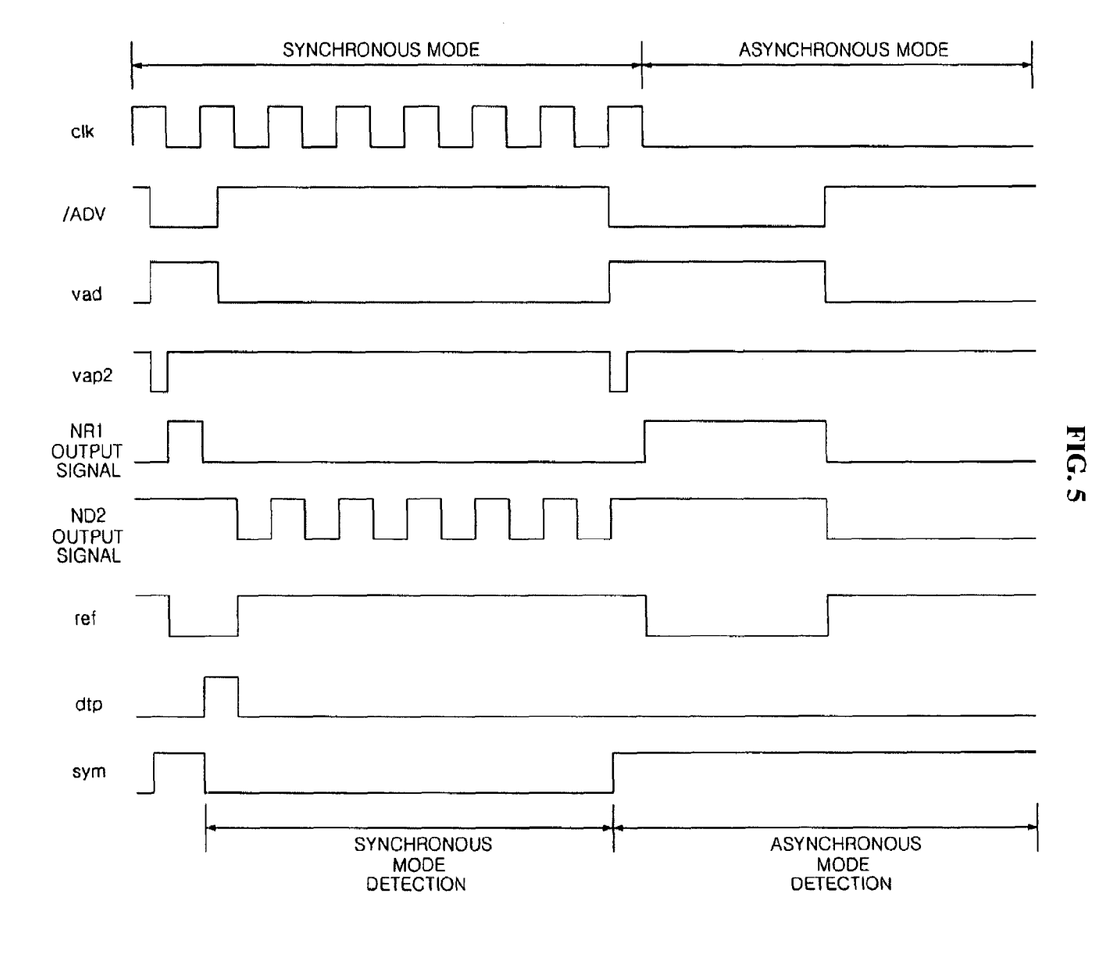
FIG. 5 is a timing chart illustrating the operation of the circuit for detecting a synchronous mode shown in FIG. 4.

FIG. 5 shows the clock clk, a /ADV signal, the valid address signal vad, the second valid address pulse signal vap2, the output signal of the first NOR gate NR1, the output signal of the second NAND gate ND2, the reference signal ref, the detection pulse signal dtp, and the synchronous mode signal sym.

In order to distinguish the synchronous mode from the asynchronous mode, a period where the clock clk is input and a period where the clock clk is not input are respectively shown. As shown in FIG. 5 the valid address is enabled by the /ADV signal.

If the valid address signal vad is enabled, the second valid address pulse signal vap2 output from the third NAND gate ND3 of the control unit 70 is also enabled. At this time, the second valid address pulse signal vap2 is a low level enable signal with a falling edge time that is formed according to a rising edge time of the valid address signal vad and also with an enable time shorter than the valid address signal vad. In the timing chart of FIG. 5, the characteristics of the second valid address pulse signal vap2 is shown.

A signal that is output from the first NOR gate NR1 of the first signal combining unit 40 is formed by inverting the clock clk during a period where the valid address signal vad is enabled. Further, a signal output from the second NAND gate ND2 has a high-level voltage during a period where the valid address signal vad is enabled, and has the same voltage level as the clock clk during a period where the valid address signal vad is disabled.

When both the output signal of the first NOR gate NR1 and the output signal of the second NAND gate ND2 are at a high level, the voltage level of the reference signal ref that is an output signal of the first signal combining unit 40 is changed to the low level. Subsequently, the first latch unit 50 stores and non-inversely drives the reference signal ref at that time so as to maintain the level of the reference signal ref and to output the reference signal ref. In addition, when both the output signal of the first NOR gate NR1 and the output signal of the second NAND gate ND2 are at a low level, the voltage level of the reference signal ref is changed to the high level. Similarly, the first latch unit 50 stores and non-inversely drives the reference signal ref at that time so as to maintain the level of the reference signal ref and to output the reference signal ref.

When the output signal of the first latch unit 50 is at a low level, the detection pulse signal dtp has a high-level voltage if the clock clk is at a high level, and a low-level voltage in other cases.

The synchronous mode signal sym is generated by inversely driving and latching the detection pulse signal dtp at a time when the second valid address pulse signal vap2 is enabled. Even though the second valid address pulse signal vap2 is disabled again, the detection pulse signal dtp maintains the level of the previously generated voltage. Subsequently, at the rising edge time of the detection pulse signal dtp, the synchronous mode signal sym is at a falling edge time, and the low level voltage formed at that time is maintained until the second valid address pulse signal vap2 is enabled. Since the synchronous mode signal sym is a low level enable signal, referring to FIG. 5, it can be seen that the synchronous mode signal sym is enabled by the detection pulse signal dtp generated when the clock clk is detected, and it is disabled upon entering the asynchronous mode.

In the circuit for detecting synchronous mode shown in FIGS. 1 and 2, there is a problem in that, if the clock clk is at a high level when the first valid address pulse signal vap1 is enabled, the circuit does not detect the entrance of the asynchronous mode.

Meanwhile, the circuit for detecting synchronous mode shown in FIGS. 3 and 4 generates the synchronous mode signal sym by non-inversely driving the detection pulse signal dtp, not the clock clk, during a period where the second valid address pulse signal vap2 is enabled, thereby solving the above-described problem. That is, the detection pulse signal dtp is generated by the combination of the valid address signal vad and the clock clk and, even though the clock clk is at high level when the valid address signal vad is enabled, the detection pulse signal dtp maintains the low-level voltage. Accordingly, in the asynchronous mode, the synchronous mode signal sym has a high-level voltage.

As such, the circuit for detecting synchronous mode drives and latches the clock clk according to the control of the valid address signal vad so as to generate the synchronous mode signal sym. Subsequently, the apparatuses that receive the synchronous mode signal sym can recognize that a current mode is the asynchronous mode since the synchronous mode signal sym is disabled if the clock clk is not input, and the apparatuses can also recognize that a current mode is the synchronous mode since the synchronous mode signal sym is enabled if the clock clk is input.

As described above, if the circuit for detecting a synchronous mode for a semiconductor memory apparatus according to an embodiment of the invention is applied, it is possible to overcome a technical limitation of a semiconductor memory apparatus to selectively use the clock. That is, according to the selective input of the clock, since the synchronous mode and the asynchronous mode operate separately, the individual circuits in semiconductor memory apparatus can easily cope with the change of the operation mode. Further, by applying a circuit capable of solving a side effect that the asynchronous mode is not recognized, it is possible to improve the technical completeness of the synchronous mode detection circuit.

It will be apparent to those skilled in the art that various modifications and changes may be made without departing from the scope and spirit of the present invention. Therefore, it should be understood that the above embodiments are not limiting, but illustrative in all aspects. The scope of the invention is defined by the appended claims rather than by the description preceding them, and therefore all changes and modifications that fall within the metes and bounds of the claims, or equivalents of such metes and bounds are therefore intended to be embraced by the claims.

The synchronous mode detection circuit for a semiconductor memory apparatus according to embodiments of the present invention enables the synchronous mode signal if the clock is input and disables the synchronous mode signal if the clock is not input, thereby allowing the synchronous mode and the asynchronous mode to be distinguished from each other.

What is claimed is:

1. A circuit for detecting a synchronous mode in a semiconductor memory apparatus, the circuit comprising:

a control unit configured to control supplying a voltage source according to whether or not a valid address signal is enabled;

a driving unit configured to drive a clock according to the supplying of the voltage source by the control unit; and a latch unit configured to latch the clock driven by the driving unit and to output a synchronous mode signal.

2. The circuit of claim 1, wherein the control unit comprises:

a pulse generator configured to receive the valid address signal and to output a valid address pulse signal; and a voltage driver configured to drive a peripheral voltage according to whether or not the valid address pulse signal is enabled.

3. The circuit of claim 2, wherein the pulse generator comprises:

a delay unit configured to delay the valid address signal by a predetermined time and produce an output signal;

an inverter configured to invert the output signal of the delay and to produce an output signal; and a NAND gate configured to receive the valid address signal and the output signal of the inverter and to output the valid address pulse signal.

4. The circuit of claim 2, wherein the voltage driver comprises a first transistor having a gate terminal configured to receive the valid address pulse signal, a source terminal configured to receive the peripheral voltage, and a drain terminal coupled with the driving unit.

5. The circuit of claim 4, wherein the driving unit comprises:

a first node;

a second transistor, having a gate terminal configured to receive the clock, a source terminal coupled with the control unit, and a drain terminal coupled with the first node; and a third transistor having a gate terminal configured to receive the clock, a drain terminal coupled with the first node, and a source terminal coupled with a ground terminal, and wherein the first node is an output terminal.

6. The circuit of claim 1, wherein the latch unit comprises two inverters forming a latch structure for the clock driven by the driving unit, and which outputs the synchronous mode signal.

7. The circuit of claim 5, wherein the drain terminal of the first transistor is coupled with the source terminal of the second transistor.

8. The circuit of claim 1, wherein the valid address signal comprises a high enable signal generated by inverting a valid address command.

9. The circuit of claim 2, wherein the valid address pulse signal comprises a low enable signal having an enable time shorter than an enable time for the valid address signal.

10. A circuit for detecting synchronous mode for a semiconductor memory apparatus, the circuit comprising:

a control unit configured to generate a valid address pulse signal to control supplying of a first voltage, when a valid address signal is enabled;

a driving unit configured to inversely drive a clock regardless of the first voltage supplied from the control unit when the a clock is at a high level, and to inversely drive the clock when the first voltage is supplied from the control unit when the clock is at a low level; and a latch unit configured to latch the clock driven by the driving unit and to output a synchronous mode signal based on the latched clock.

11. The circuit of claim 10,
wherein the control unit comprises:
a pulse generator configured to receive the valid address signal and to output a valid address pulse signal based on the valid address signal; and
a voltage driver configured to drive the first voltage according to whether or not the valid address pulse signal is enabled.

12. The circuit of claim 11,
wherein the pulse generator comprises:
a delay unit configured to delay the valid address signal by a predetermined time and produce an output signal;
an inverter configured to invert the output signal of the delay unit and produce an output signal; and
a NAND gate configured to receive the valid address signal and the output signal of the inverter and to output the valid address pulse signal.

13. The circuit of claim 11,
wherein the voltage driver comprises a first transistor, having a gate terminal configured to receive the valid address pulse signal, a source terminal configured to receive the first voltage, and a drain terminal coupled with the driving unit.

14. The circuit of claim 13,
wherein the driving unit comprises:
a first node;
a second transistor having a gate terminal configured to receive to which the clock, a source terminal coupled with the control unit, and a drain terminal coupled with the first node; and
a third transistor having a gate terminal configured to receive the clock, a drain terminal coupled with the first node, and a source terminal coupled with a ground terminal, and wherein
the first node is an output terminal.

15. The circuit of claim 10,
wherein the latch unit comprises two inverters forming a latch structure for the clock driven by the driving unit, and which outputs the synchronous mode signal.

16. The circuit of claim 14,
wherein the drain terminal of the first transistor is coupled with the source terminal of the second transistor.

17. The circuit of claim 10,
wherein the first voltage comprises a peripheral voltage.

18. The circuit of claim 10,
wherein the valid address signal comprises a high enable signal generated by inverting a valid address command.

19. The circuit of claim 11,
wherein the valid address pulse signal comprises a low enable signal having an enable time shorter than an enable time for the valid address signal.

20. A circuit for detecting a synchronous mode in a semiconductor memory apparatus, the circuit comprising:
a first signal combining unit configured to combine a valid address signal and a clock to generate a reference signal;
a first latch unit configured to latch the reference signal and produce an output signal;
a second signal combining unit configured to combine the output signal of the first latch unit and the clock to generate a detection pulse signal;
a control unit configured to control supplying a voltage source according to whether or not the valid address signal is enabled;
a driving unit configured to drive the detection pulse signal according to the supplying of the voltage source by the control unit; and
a second latch unit configured to latch the detection pulse signal driven by the driving unit and to output a synchronous mode signal.

21. The circuit of claim 20,
wherein the first signal combining unit comprises:
a first node;
a first inverter configured to invert the valid address signal and produce an output signal;
a second inverter configured to invert the clock and produce an output signal;
a NAND gate configured to receive the output signal of the first inverter and the output signal of the second inverter and produce an output signal;
a NOR gate configured to receive the output signal of the first inverter and the clock and produce an output signal;
a first transistor having a gate terminal configured to receive the output signal of the NAND, a source terminal configured to receive a peripheral voltage, and a drain terminal coupled with the first node; and
a second transistor, having a gate terminal configured to receive the output signal of the NOR gate, a drain terminal coupled with the first node, and a source terminal coupled with a ground terminal, wherein
the reference signal is output from the first node.

22. The circuit of claim 20,
wherein the first latch unit comprises:
a first inverter configured to invert the reference signal and produce output signal;
a second inverter forming a latch structure together with the first inverter; and
a third inverter configured to invert the output signal of the first inverter.

23. The circuit of claim 20,
wherein the second signal combining unit comprises:
an inverter configured to invert the clock and produce an output signal; and
a NOR gate configured to receive the output signal of the inverter and the output signal of the first latch unit and to output the detection pulse signal.

24. The circuit of claim 20,
wherein the control unit comprises:
a pulse generator configured to receive the valid address signal and outputs a valid address pulse signal; and
a voltage driver configured to drive a peripheral voltage according to whether or not the valid address pulse signal is enabled.

25. The circuit of claim 24,
wherein the pulse generator comprises:
a delay unit configured to delay the valid address signal by a predetermined time and produce an output signal;
an inverter configured to invert the output signal of the delay unit and produce and output signal; and
a NAND gate configured to receive the valid address signal and the output signal of the inverter and to output the valid address pulse signal.

26. The circuit of claim 24,
wherein the voltage driver comprises a first transistor having a gate terminal configured to receive the valid address pulse signal, a source terminal configured to receive the peripheral voltage, and a drain terminal coupled with the driving unit.

27. The circuit of claim 26,
wherein the driving unit comprises:
a first node;

a second transistor having a gate terminal configured to receive the detection pulse signal, a source terminal coupled with the control unit, and a drain terminal coupled with the first node; and a third transistor, having a gate terminal configured to receive the detection pulse signal, a drain terminal coupled with the first node, and a source terminal is coupled with a ground terminal.

28. The circuit of claim 20,
wherein the second latch unit comprises two inverters that form a latch structure for the detection pulse signal transmitted from the driving unit, and which outputs the synchronous mode signal.

29. The circuit of claim 27,
wherein the drain terminal of the first transistor is coupled with the source terminal of the second transistor.

30. The circuit of claim 20,
wherein the valid address signal comprises a high enable signal generated by inverting a valid address command.

31. The circuit of claim 24,
wherein the valid address pulse signal comprises a low enable signal having an enable time shorter than an enable of the valid address signal.

32. A circuit for detecting a synchronous mode in a semiconductor memory apparatus, the circuit comprising:

a first signal combining unit configured to generate first and second signals by driving a clock according to whether or not a valid address signal is enabled, and generate a reference signal from the first and second signals;

a first latch unit configured to latch the reference signal and produce an output signal;

a second signal combining unit configured to generate a detection pulse signal forming a low-level voltage if the output signal of the first latch unit is at a high level, and forming a high-level voltage through inversion of the clock if the output signal of the first latch unit is at a low level;

a control unit configured to generate a valid address pulse signal to control the supply of a first voltage, when a valid address signal is enabled;

a driving unit configured to inversely drive the clock regardless of the supply of the first voltage when the a clock is at a high level, and inversely drive the clock when the first voltage is supplied when the clock is at a low level; and a second latch unit configured to latch the clock driven by the driving unit and outputs a synchronous mode signal.

33. The circuit of claim 32,
wherein the first signal combining unit comprises:
a first node;
a first inverter configured to invert the valid address signal and produce an output signal;
a second inverter configured to invert the clock and produce an output signal;
a NAND gate configured to receive the output signal of the first inverter and the output signal of the second inverter and produce an output signal;
a NOR gate configured to receive the output signal of the first inverter and the clock and produce an output signal;
a first transistor having a gate terminal configured to receive the output signal of the NAND gate, a source terminal configured to receive the first voltage, and a drain terminal is coupled with the first node; and
a second transistor, having a gate terminal configured to receive the output signal of the NOR gate, a drain terminal coupled with the second node, and a source terminal coupled with a ground terminal, and wherein
the reference signal is output from the first node.

34. The circuit of claim 33,
wherein the first latch unit comprises:
a first inverter configured to invert the reference signal and produce an output signal;
a second inverter forming a latch structure together with the first inverter; and
a third inverter configured to invert the output signal of the first inverter.

35. The circuit of claim 32,
wherein the second signal combining unit comprises:
an inverter configured to invert the clock and produce an output signal; and
a NOR gate that configured to receive the output signal of the inverter and the output signal of the first latch unit and generate the detection pulse signal.

36. The circuit of claim 32,
wherein the control unit comprises:
a pulse generator configured to receive the valid address signal and output the valid address pulse signal; and
a voltage driver configured to drive the first voltage according to whether or not the valid address pulse signal is enabled.

37. The circuit of claim 36,
wherein the pulse generator comprises:
a delay unit configured to delay the valid address signal by a predetermined time and produce an output signal;
an inverter configured to invert the output signal of the delay unit and produce an output signal; and
a NAND gate configured to receive the valid address signal and the output signal of the inverter and output the valid address pulse signal.

38. The circuit of claim 36,
wherein the voltage driver comprises a first transistor having a gate terminal configured to receive the valid address pulse signal, a source terminal configured to receive the first voltage, and a drain terminal coupled with the driving unit.

39. The circuit of claim 38,
wherein the driving unit comprises:
a first node;
a second transistor having a gate terminal configured to receive the detection pulse signal, a source terminal coupled with the control unit, and a drain terminal coupled with the first node; and
a third transistor having a gate terminal configured to receive the detection pulse signal, a drain terminal coupled with the first node, and a source terminal coupled with a ground terminal.

40. The circuit of claim 32,
wherein the second latch unit comprises two inverters forming a latch structure for the clock transmitted from the driving unit, and configured to output the synchronous mode signal.

41. The circuit of claim 39,
wherein the drain terminal of the first transistor is coupled with the source terminal of the second transistor.

42. The circuit of claim 32,
wherein the first voltage comprises a peripheral voltage.

43. The circuit of claim 32,
wherein the valid address signal comprises a high enable signal generated by inverting a valid address command.

44. The circuit of claim 36,
wherein the valid address pulse signal comprises a low enable signal having an enable time shorter than the valid address signal.

45. A method for detecting a synchronous mode in a semiconductor memory apparatus, the method comprising:
controlling supplying a first voltage according to whether or not a valid address signal is enabled;
driving a clock according to the supplying of the first voltage; and
latching the driven clock and outputting a synchronous mode signal.

46. The method of claim 45,
wherein the controlling comprises generating a valid address pulse signal if the valid address signal is enabled, and supplying or terminating a first voltage used for driving the clock according to whether or not the valid address pulse signal is enabled.

47. The method of claim 46,
wherein the first voltage comprises a peripheral voltage.

48. The method of claim 45,
wherein the driving comprises, if the clock is at a high level, inversely driving the clock regardless of the supply of the first voltage, and, if the clock is at a low level, inversely driving the clock when the first voltage is supplied.

49. The method of claim 48,
wherein the first voltage comprises a peripheral voltage.

50. The method of claim 45,
wherein the valid address signal comprises a high enable signal generated by inverting a valid address command.

51. The method of claim 46,
wherein the valid address pulse signal comprises a low enable signal having an enable time shorter than the valid address signal.

52. A method for detecting a synchronous mode in a semiconductor memory apparatus, the method comprising:
combining a valid address signal and a clock to generate a reference signal;
latching the reference signal;
combining the latched signal and the clock to generate a detection pulse signal;
controlling supplying a voltage source according to whether or not the valid address signal is enabled;
driving the detection pulse signal according to the supplying of the voltage source; and
latching the driven detection pulse signal and outputting a synchronous mode signal.

53. The method of claim 52,
wherein the combining of the valid address signal and the clock to generate the reference signal comprises driving the clock according to whether or not the valid address signal is enabled to generate first and second signals and generating the reference signal from the first and second signals.

54. The method of claim 52,
wherein the combining of the latched signal and the clock so as to generate the detection pulse signal comprises generating the detection pulse signal so that, if the latched reference signal is at a high level, it has a low-level voltage, and, if the latched reference signal is at a low level, it has a voltage level of the non-inversely driven clock.

55. The method of claim 52,
wherein the controlling comprises generating a valid address pulse signal if the valid address signal is enabled, and supplying or terminating a first voltage used for driving the clock according to whether or not the valid address pulse signal is enabled.

56. The method of claim 55,
wherein the first voltage comprises a peripheral voltage.

57. The method of claim 52,
wherein the driving comprises, if the clock is at a high level, inversely driving the clock regardless of the supply of the first voltage, and, if the click is at a low level, inversely driving the clock when the first voltage is supplied.

58. The method of claim 57,
wherein the first voltage comprises a peripheral voltage.

59. The method of claim 52,
wherein the valid address signal comprises a high enable signal generated by inverting a valid address command.

60. The method of claim 55,
wherein the valid address pulse signal comprises a low enable signal having an enable time shorter than the valid address signal.

* * * * *